US010837110B2

(12) United States Patent
Sato et al.

(10) Patent No.: US 10,837,110 B2
(45) Date of Patent: Nov. 17, 2020

(54) SUBSTRATE PROCESSING APPARATUS AND METHOD FOR PROCESSING A SUBSTRATE

(71) Applicant: Tokyo Electron Limited, Tokyo (JP)

(72) Inventors: Kaoru Sato, Iwate (JP); Kiichi Takahashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 1123 days.

(21) Appl. No.: 14/482,047

(22) Filed: Sep. 10, 2014

(65) Prior Publication Data
US 2015/0078864 A1 Mar. 19, 2015

(30) Foreign Application Priority Data

Sep. 18, 2013 (JP) ................................. 2013-193412

(51) Int. Cl.
*C23C 16/458* (2006.01)
*C23C 16/455* (2006.01)
*H01L 21/687* (2006.01)

(52) U.S. Cl.
CPC ...... *C23C 16/4586* (2013.01); *C23C 16/4584* (2013.01); *C23C 16/45521* (2013.01);
(Continued)

(58) Field of Classification Search
CPC .......... C23C 16/4586; C23C 16/45521; C23C 16/45551; C23C 16/4584;
(Continued)

(56) References Cited

U.S. PATENT DOCUMENTS 6,634,845 B1 * 10/2003 Komino ................. B65G 49/06
414/217
2010/0055320 A1 * 3/2010 Honma ............. H01L 21/68771
427/255.28
(Continued)

FOREIGN PATENT DOCUMENTS

JP H08-097274 4/1996
JP H09-147786 6/1997
(Continued)

*Primary Examiner* — Kambiz Zand
*Assistant Examiner* — Mirza Israr Javed
(74) *Attorney, Agent, or Firm* — IPUSA, PLLC

(57) ABSTRACT

A substrate processing apparatus is provided to deposit a film including a reaction product on a substrate by repeating a supply cycle of sequentially supplying at least two kinds of reaction gases reactable with each other to a surface of the substrate in a chamber. The substrate processing apparatus includes a turntable provided in the chamber and having a concave portion for receiving the substrate formed in its surface and through-holes formed in the concave portion, a lifting mechanism including lift pins used when transferring the substrate placed on the concave portion, and a control unit configured to control the lifting mechanism. The control unit controls the lifting mechanism to carry the substrate out of the concave portion by moving the lifting pins upward in a vertical direction and inward in a radial direction of the turntable after the lifting pins contact the substrate through the through-holes.

5 Claims, 10 Drawing Sheets

(52) U.S. Cl.
CPC .. *C23C 16/45551* (2013.01); *H01L 21/68742* (2013.01); *H01L 21/68764* (2013.01); *H01L 21/68771* (2013.01); *C23C 16/45561* (2013.01)

(58) Field of Classification Search
CPC ......... C23C 16/45561; H01L 21/68771; H01L 21/68764; H01L 21/68742
See application file for complete search history.

(56) References Cited

U.S. PATENT DOCUMENTS

| | | | | |
|---|---|---|---|---|
| 2010/0086784 | A1* | 4/2010 | Patalay | H01L 21/68742 428/411.1 |
| 2010/0133257 | A1* | 6/2010 | Sorabji | H01L 21/67115 219/447.1 |
| 2011/0126985 | A1* | 6/2011 | Ohizumi | C23C 16/45546 156/345.55 |
| 2013/0287529 | A1* | 10/2013 | Yang | H01L 21/67742 414/222.09 |
| 2015/0078864 | A1* | 3/2015 | Sato | H01L 21/68764 414/222.08 |
| 2017/0125282 | A1* | 5/2017 | Umehara | H01L 21/68785 |
| 2017/0211181 | A1* | 7/2017 | Oyama | C23C 16/45551 |
| 2017/0241018 | A1* | 8/2017 | Oyama | C23C 16/401 |

FOREIGN PATENT DOCUMENTS

| | | |
|---|---|---|
| JP | 2010-087476 | 4/2010 |
| JP | 4661990 | 3/2011 |
| TW | 201026883 | 7/2010 |
| TW | 201138014 | 11/2011 |

\* cited by examiner

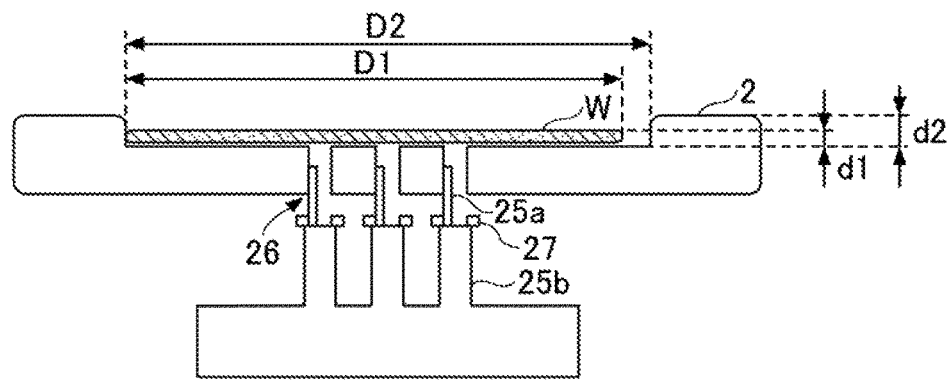
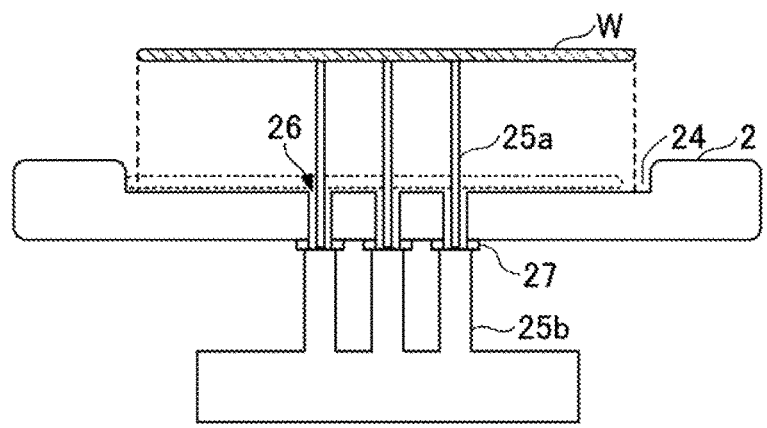
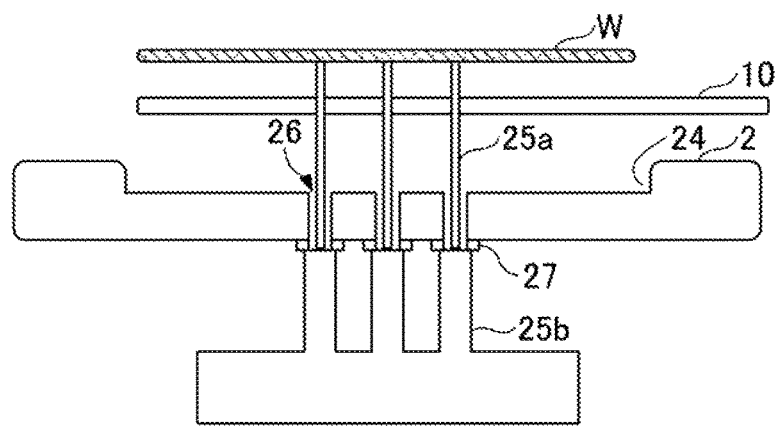
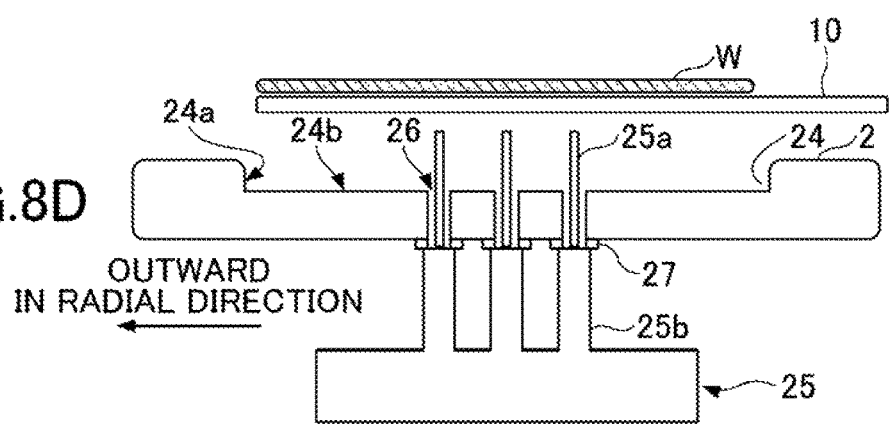

SUBSTRATE PROCESSING APPARATUS AND METHOD FOR PROCESSING A SUBSTRATE

CROSS-REFERENCE TO RELATED APPLICATIONS

This patent application is based upon and claims the benefit of priority of Japanese Patent Application No. 2013-193412, filed on Sep. 18, 2013, the entire contents of which are incorporated herein by reference.

BACKGROUND OF THE INVENTION

1. Field of the Invention

The present invention relates to a substrate processing apparatus and a method for processing a substrate.

2. Description of the Related Art

In manufacturing semiconductor devices, a variety of film deposition processes is performed on a semiconductor wafer (hereinafter, a wafer) to be processed by a method such as an atomic layer deposition (ALD) method. In a film deposition apparatus implementing the film deposition process, a heating unit is provided in a susceptor for receiving a wafer, thereby proceeding with the variety of film deposition processes while heating the wafer indirectly.

In recent years, as disclosed in Japanese Patent No. 4661990, development and research of a so-called turntable type film deposition apparatus have been advanced as the film deposition apparatus for implementing the ALD method. The film deposition apparatus includes a rotatable turntable having a concave portion with a diameter slightly larger than the wafer that can receive a plurality of wafers and arranged in a vacuum chamber. The film deposition apparatus also includes a supply area of a reaction gas A, a supply area of a reaction B gas and a separation area that separates these supply areas from each other that are divided above the turntable.

However, in the turntable type film deposition apparatus disclosed in Japanese Patent No. 4661990, the wafer is shifted to the outer peripheral side in a rotational direction of the concave portion by a centrifugal force after finishing the film deposition. When lifting the wafer vertically upward from this state to carry the wafer out of the concave portion, sometimes the wafer is rubbed against an outer wall of the concave portion, thereby generating particles.

SUMMARY OF THE INVENTION

Embodiments of the present invention provide a substrate processing apparatus and a method for processing a substrate solving one or more of the problems discussed above.

More specifically, the embodiments of the present invention may provide a substrate processing apparatus and a method for processing a substrate that can prevent particles from being generated when carrying the wafer out thereof.

According to one embodiment of the present invention, there is provided a substrate processing apparatus to deposit a film including a reaction product on a substrate by repeating a supply cycle of sequentially supplying at least two kinds of reaction gases reactable with each other to a surface of the substrate in a chamber. The substrate processing apparatus includes a turntable provided in the chamber and having a concave portion for receiving the substrate formed in its surface and through-holes formed in the concave portion, a lifting mechanism including lift pins used when transferring the substrate placed on the concave portion, and a control unit configured to control an operation of the lifting mechanism. The control unit controls the lifting mechanism so as to carry the substrate out of the concave portion by moving the lifting pins upward in a vertical direction and inward in a radial direction of the turntable after the lifting pins contact the substrate through the through-holes.

According to another embodiment of the present invention, there is provided a method for processing a substrate by processing a substrate while rotating a turntable having a concave portion to receive the substrate on its surface and through-holes formed in the concave portion and provided in a chamber when the substrate is placed on the concave portion, and by carrying the substrate out of the concave portion by using the lifting mechanism including lifting pins. In the method, the substrate is carried out of the concave portion by moving the lifting pins upward in a vertical direction and inward in a radial direction of the turntable after the lifting pins contact the substrate through the through-holes.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 8A through 8D are schematic diagrams for illustrating a substrate carry-out method according to the first embodiment of the present invention;

DETAILED DESCRIPTION OF THE PREFERRED EMBODIMENTS

A description is given below of embodiments of the present invention, with reference to accompanying drawings.

(Configuration of Substrate Processing Apparatus)

In an embodiment of the present invention, a description is given below of a substrate processing apparatus using a so-called turntable (described later) that deposits a film on surfaces of a plurality of substrates by alternately supplying mutually reactive two kinds or more of gasses.

Figure 1:
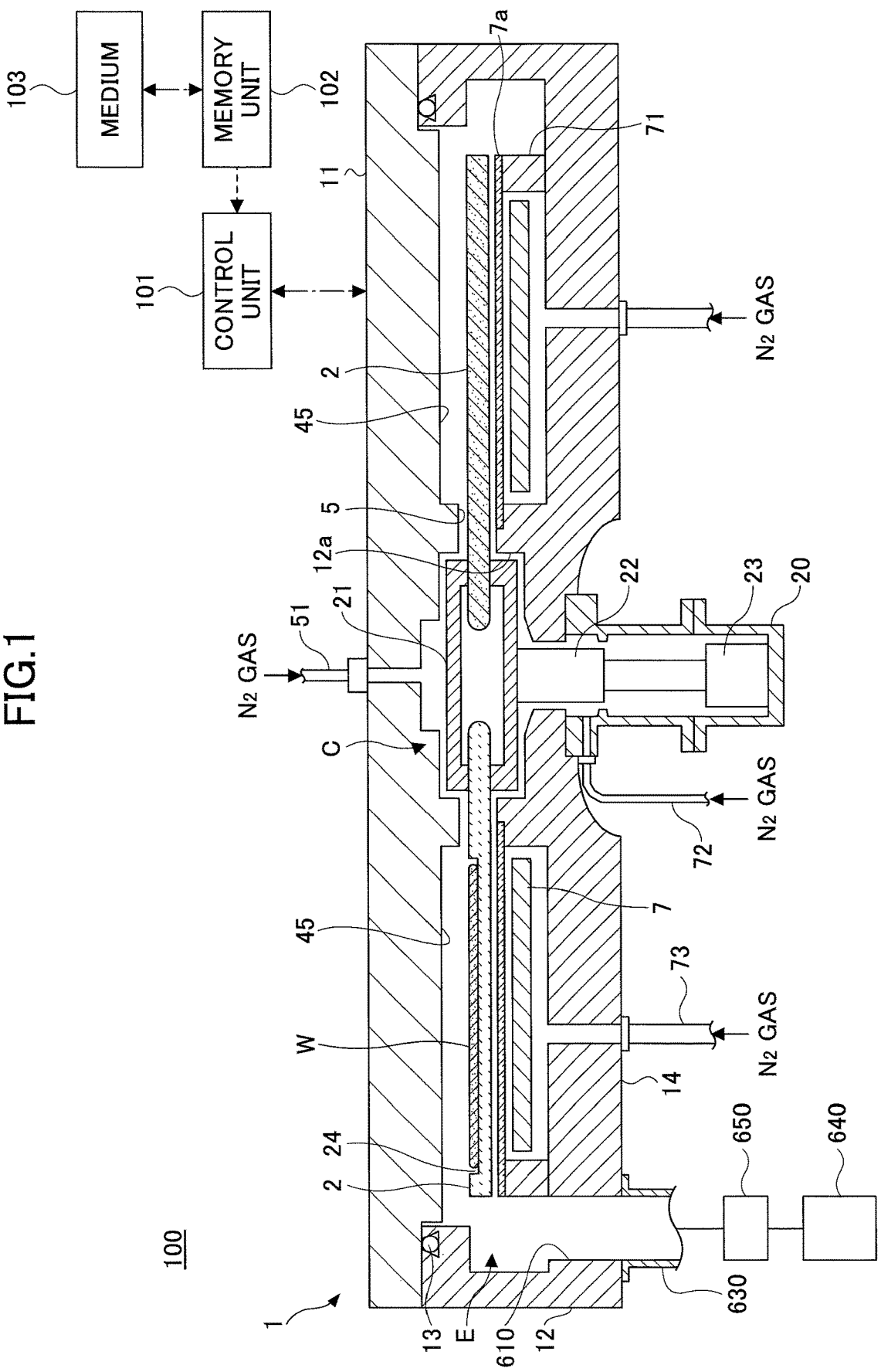
FIG. 1 is a schematic configuration diagram illustrating an example of a substrate processing apparatus according to an embodiment of the present invention.
Figure 2:
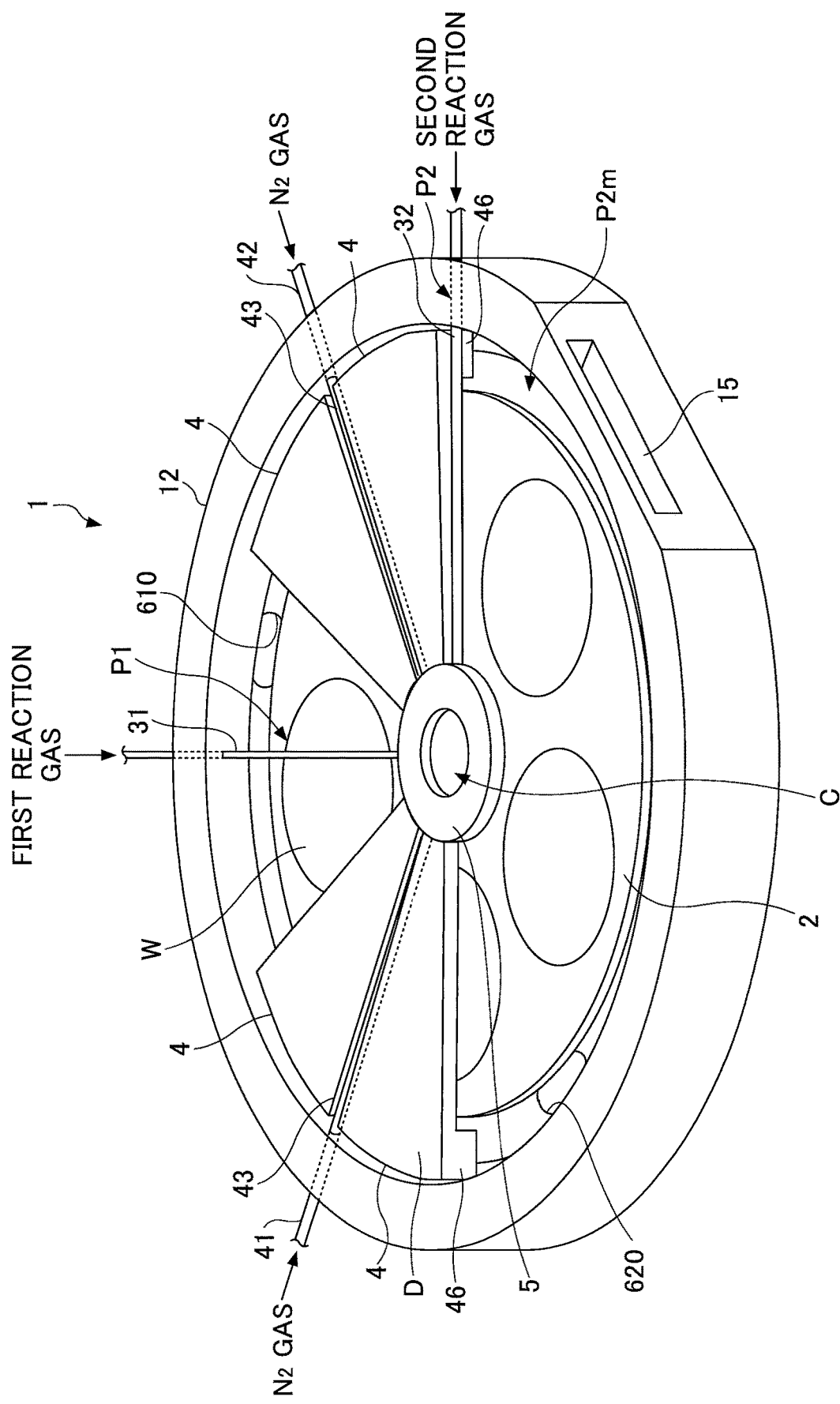
FIG. 2 is a schematic perspective view illustrating an example of an inner structure of a substrate processing apparatus according to an embodiment of the present invention.
Figure 3:
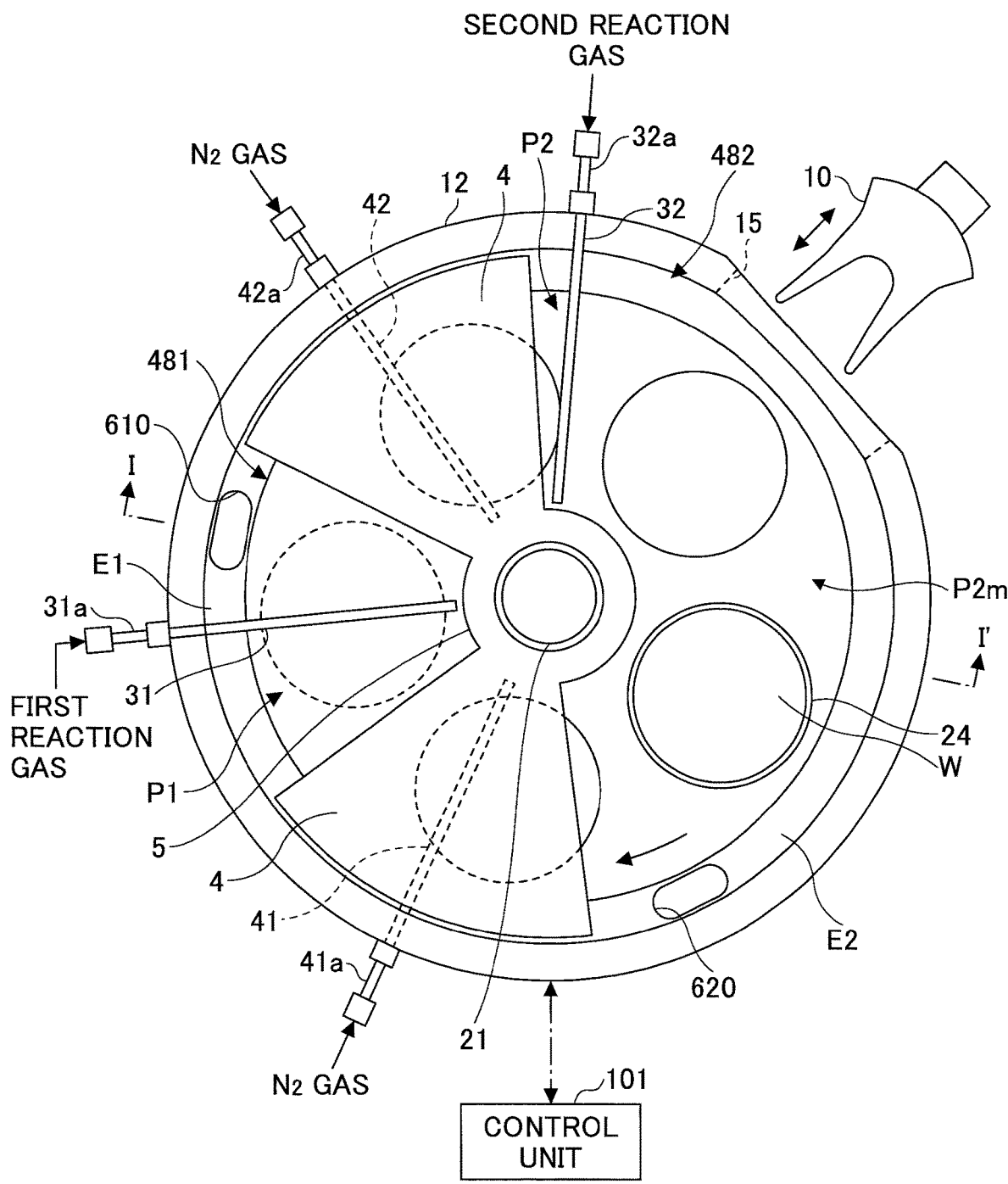
FIG. 3 is a schematic plan view illustrating an inner structure of a substrate processing apparatus according to an embodiment of the present invention.

FIG. 1 is a schematic configuration diagram illustrating an example of a substrate processing apparatus according to an embodiment of the present invention. FIG. 2 is a schematic perspective view of an inner structure of the substrate processing apparatus, and FIG. 3 is a schematic plan view of the inner structure of the substrate processing apparatus of the embodiment of the present invention. Here, FIG. 1 illustrates a cross-section along a I-I' line in FIG. 3, and depiction of a ceiling plate 11 (see FIG. 1) is omitted in FIGS. 2 and 3 for the purpose of illustration.

With reference to FIGS. 1 through 3, the substrate processing apparatus 100 includes a flattened chamber 1 having an approximately round planar shape, and a turntable 2 provided in the chamber 1 having a center of rotation that coincides with the center of the chamber 1. The chamber 1 is a container to hold a substrate to be processed therein and to perform a film deposition process on the substrate. As illustrated in FIG. 1, the chamber 1 includes a ceiling plate 11 and a chamber body 12. The chamber body 12 has a cylindrical shape including a circular bottom. The ceiling plate 11 is hermetically arranged on an upper surface of the chamber body 12 through a sealing member, for example, an O-ring 13 in a way attachable to/detachable from the upper surface of the chamber body 12.

Moreover, the chamber 1 may include an exhaust port 610 connected to a vacuum pump 640, and may be configured as a vacuum chamber capable of being evacuated.

The turntable 2 is a substrate placement table to receive a substrate. Although the substrate is not necessarily limited to the semiconductor wafer W, an example is given hereinafter in which the semiconductor wafer (which is hereinafter called "a wafer") W is used as the substrate. The turntable 2 has concave portions 24 formed in a surface thereof and having a circular and depressed shape, and supports a substrate on the concave portion 24. FIG. 1 illustrates a state of a semiconductor wafer W being placed on the concave portion 24 as the substrate. FIG. 3 illustrates a single wafer W only on a single concave portion 24 for the purpose of illustration.

This concave portion 24 has an inner diameter that is slightly greater, for example, 1 to 4 mm, than a diameter of the wafer W. Moreover, the concave portion 24 is configured to have the depth approximately equal to or greater than the thickness of the wafer. Accordingly, when the wafer W is fitted in the concave portion 24, the surface of the wafer W and the surface of the turntable 2 (which means an area where the wafer is not placed) have approximately the same height, or the surface of the wafer W is lower than the surface of the turntable 2. Even when the concave portion 24 is configured to be deeper than the thickness of the wafer W, the depth is preferably configured to be equal to or less than about three times as deep as the thickness of the wafer W because too deep of a concave portion could affect the film deposition.

The turntable 2 is made of, for example, quartz, and is fixed to a core portion 21 having a cylindrical shape at the central portion. The core portion 21 is fixed to an upper end of a rotational shaft 22 that extends in a vertical direction. As illustrated in FIG. 1, the rotational shaft 22 penetrates through a bottom part 14 of the chamber 1, and the lower end of the rotational shaft 22 is attached to a motor 23 that rotates the shaft 22 around the vertical axis. The rotational shaft 22 and the motor 23 are housed in a cylindrical case body 20 whose upper surface is open. This case body 20 is hermetically attached to a lower surface of the bottom part 14 of the chamber 1 through a flange part 20a provided on an upper surface of the case body 20, by which the internal atmosphere of the case body 20 is separated from the external atmosphere.

Furthermore, as shown in FIGS. 2 and 3, a transfer opening 15 is formed in the side wall of the chamber 1 to transfer the wafers W, which are the substrates, between an external transfer arm 10 and the turntable 2. The transfer opening 15 is configured to be hermetically openable and closeable by a gate valve not shown in FIGS. 2 and 3. Moreover, the wafers W are transferred between the concave portions 24, which are the wafer receiving areas in the turntable 2, and the transfer arm 10 at a position where one of the concave portions 24 faces the transfer opening 15. Hence, a wafer holding mechanism 25 is provided on the bottom side of the concave portion 24 to support the back surface of the wafer W and to move the wafer W up and down. A description is given later of a detail of the wafer holding mechanism 25 and a detail of a wafer carry-in and carry-out method according to an embodiment of the present invention.

As illustrated in FIGS. 2 and 3, above the turntable 2, a reaction gas nozzle 31, a reaction gas nozzle 32, and separation gas nozzles 41 and 42 are arranged at intervals in a circumferential direction (in a rotational direction of the turntable 2 (indicated by an arrow A in FIG. 3)) of the chamber 1. In an example illustrated in FIGS. 2 and 3, a separation gas nozzle 41, the reaction gas nozzle 31, the separation gas nozzle 42, and the reaction gas nozzle 32 are arranged in a clockwise fashion (in the rotational direction of the turntable 2) from a transfer opening 15 described later in this order.

These nozzles 31, 32, 41 and 42 are introduced into the chamber 1 from an external wall by fixing gas introduction ports, which are base end portions of the respective nozzles 31, 32, 41 and 42, to the external wall of the chamber body 12 (see FIG. 3), and are installed so as to extend along a radial direction of the chamber body 12 and to extend parallel to the turntable 2.

The reaction gas nozzle 31 is connected to a first reaction gas supply source (which is not shown in the drawings), through a pipe and a flow rate controller (both of which are not shown in the drawings). The reaction gas nozzle 32 is connected to a second reaction gas supply source (which is not shown in the drawings), through a pipe and a flow rate controller (both of which are not shown in the drawings). The separation gas nozzles 41 and 42 are both connected to a separation gas supply source (which is not shown in the drawings) of, for example, a nitrogen ($N_2$) gas used as the separation gas, through a pipe and a flow rate controller (both of which are not shown in the drawings).

The reaction gas nozzles 31 and 32 include a plurality of gas discharge holes 33 that are open downward facing the turntable 2 (see FIG. 4) and are arranged along lengthwise directions of the reaction gas nozzles 31 and 32 at intervals of, for example, 10 mm. An area under the reaction gas nozzle 31 is a first process area P1 to supply the first reaction gas and to adsorb the first reaction gas on the wafers W. An area under the reaction gas nozzle 32 is a second process area P2 to supply the second reaction gas that reacts with the first reaction gas adsorbed on the wafers W in the first process area P1.

As illustrated in FIGS. 2 and 3, two convex portions 4 are provided in the chamber 1. The convex portion 4 is attached to the back surface of the ceiling plate 11 so as to protrude toward the turntable 2 in order to form separation areas D with the separation gas nozzles 41 and 42, as described later. Furthermore, the convex portions 4 have an approximately sectorial planar shape whose apex is cut in an arc-like form. In the present embodiment, the inner arc is coupled to a protrusion portion 5 (which is described later), and the outer arc is arranged so as to be along an inner periphery of the chamber body 12 of the chamber 1.

Figure 4:
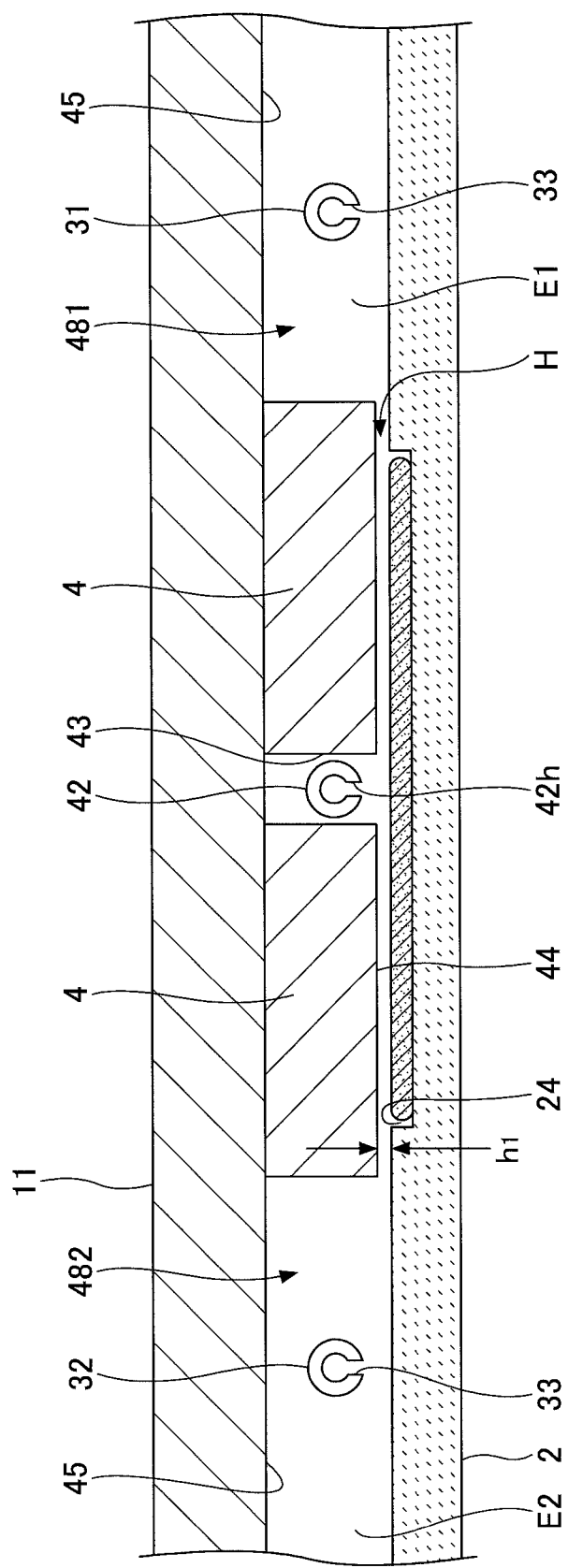
FIG. 4 is a cross-sectional view of a substrate processing apparatus along a concentric circle of a turntable according to an embodiment of the present invention.
Figure 5:
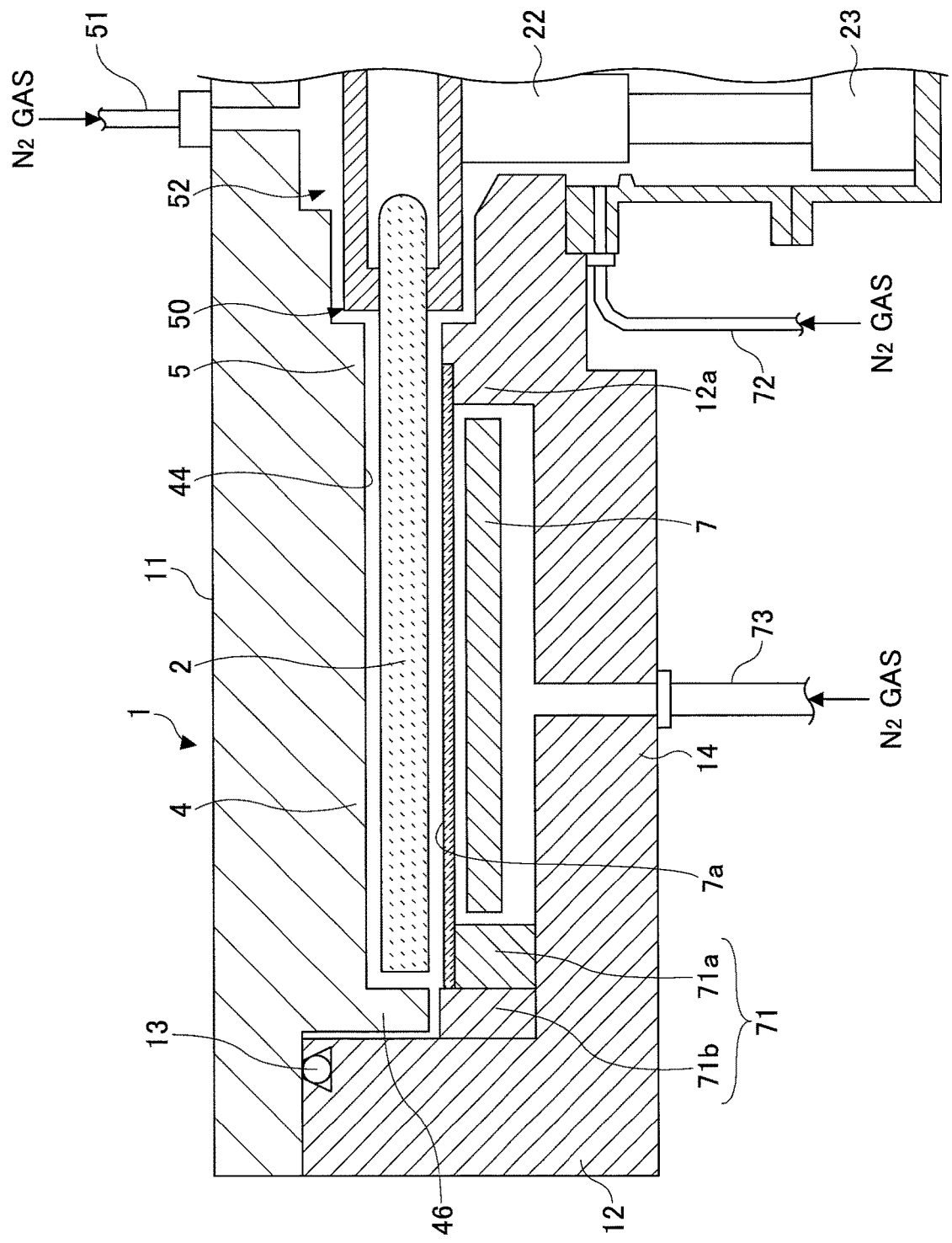
FIG. 5 is a cross-sectional view illustrating an area provided with a ceiling surface of a substrate processing apparatus according to an embodiment of the present invention.

FIG. 4 illustrates a cross-section of the chamber 1 along the concentric circle of the turntable 2, from the reaction gas nozzle 31 to the reaction gas nozzle 32. Also, FIG. 5 illustrates a cross-section of an area provided with a ceiling surface 44.

As illustrated in FIG. 4, the convex portion 4 is attached to the back surface of the ceiling plate 11, thereby forming flat and low ceiling surfaces 44 (i.e., first ceiling surfaces) that are bottom surfaces of the convex portions 4, and ceiling surfaces 45 (i.e., second ceiling surfaces) that are located on both sides of the ceiling surfaces 44 in the circumferential direction and higher than the ceiling surfaces 44.

As illustrated in FIG. 3, the convex portions 4 have an approximately sectorial planar shape whose apex is cut in an arc-like form. In addition, a groove 43 is formed in the convex portion 4 so as to extend along the radial direction of the turntable 2 at the center in the circumferential direction. The groove portion 43 houses the separation gas nozzle 42. The groove portion 43 is also formed in the other convex portion 4 in a similar way, and houses the separation gas nozzle 41 therein.

Furthermore, the reaction gas nozzles 31 and 32 are provided in a space under the high ceiling surfaces 45, respectively. These reaction gas nozzles 31 and 32 are provided in the vicinity of the wafers w apart from the ceiling surfaces 45. Here, as illustrated in FIG. 4, the reaction gas nozzle 31 is provided in a space 481 on the right and under the high ceiling surface 45, and the reaction gas nozzle 32 is provided in a space 482 on the left and under the high ceiling surface 45.

In addition, the separation gas nozzles 41 and 42 include a plurality of gas discharge holes 42h (see FIG. 4) that are open downward facing the turntable 2 (see FIG. 4) and are arranged along lengthwise directions of the separation gas nozzles 41 and 42 at intervals of, for example, 10 mm.

The ceiling surface 44 forms a separation space H that is a space narrower than the spaces 481 and 482 together with the turntable 2 therebetween. When an $N_2$ gas is supplied from the gas discharge holes 42h of the separation gas nozzle 42, the $N_2$ gas flows to the space 481 and the space 482 through the separation space H. At this time, because a volume of the separation space H is smaller than that of the spaces 481 and 482, a pressure of the separation space H can be higher than that of the spaces 481 and 482 by $N_2$ gas. In other words, the separation space H having a high pressure is formed between the spaces 481 and 482. Furthermore, $N_2$ gas flowing from the separation space H to the spaces 481 and 482 works as a counter flow against the first reaction gas flowing from the first process area P1 and the second gas flowing from the second process area P2. Accordingly, the first reaction gas from the first process area P1 and the second reaction gas from the second process area P2 are separated by the separation space H. Hence, a mixture and a reaction of the first reaction gas and the second reaction gas in the chamber 1 are reduced.

Here, a height h1 of the ceiling surface 44 relative to the upper surface of the turntable 2 is preferably set at an appropriate height to set the pressure of the separation space H higher than the pressure of the spaces 481 and 482, considering the pressure in the chamber 1, a rotational speed of the turntable 2, and a supply flow rate of the separation gas (i.e., $N_2$ gas) to be supplied.

In the meantime, with reference to FIGS. 1 through 3, a protrusion portion 5 is provided on the lower surface of the ceiling plate 11 so as to surround an outer circumference of the core portion 21 that fixes the turntable 2. In the embodiment of the present invention, this protrusion portion 5 continuously extends to a region on the rotational center side of the convex portion 4, and the lower surface of the protrusion portion 5 is formed to be the same height as the ceiling surface 44.

Moreover, as shown in FIG. 5, a bent portion 46 that is bent into an L-letter shape is formed in a periphery of the approximately sectorial convex portion 4 (i.e., a region on the outer edge of the chamber 1) so as to face the outer edge surface of the turntable 2. The bent portion 46 prevents the reaction gases from flowing into the separation areas D from both sides thereof, and prevents both of the reaction gases from mixing with each other. Because the sectorial convex portion 4 is provided on the ceiling plate 11, and the ceiling plate 11 is detachable from the chamber body 12, there is a slight gap between the outer periphery of the bent portion 46 and the inner periphery of the chamber body 12. A gap between the inner periphery of the bent portion 46 and the outer edge surface of the turntable 2, and the gap between the outer periphery of the bent portion 46 and the inner periphery of the chamber body may be, for example, set at a size similar to a height of the ceiling surface 44 relative to the upper surface of the turntable 2.

As illustrated in FIG. 5, while the inner peripheral wall of the chamber body 12 is formed into a vertical surface close to the outer periphery of the bent portion 46 in the separation areas D, for example, as illustrated in FIG. 1, locations other than the separation areas D are recessed outward from locations facing the outer edge of the turntable 2 throughout the bottom part 14. Hereinafter, for the purpose of illustration, depressed portions having a roughly rectangular cross-sectional shape along the radius direction are expressed as evacuation areas. More specifically, as illustrated in FIG. 3, an evacuation area communicated with the first process area P1 is expressed as an evacuation area E1, and an evacuation area communicated with the second process area P2 is expressed as an evacuation area E2. As illustrated in FIGS. 1 through 3, the first exhaust port 610 and a second exhaust port 620 are formed in the bottom portions of the first evacuation area E1 and the second evacuation area E2, respectively. As shown in FIG. 1, the first exhaust port 610 and the second exhaust port 620 are connected to, for example, vacuum pumps 640 of an evacuation unit through evacuation pipes 630, respectively. FIG. 1 also shows a pressure controller 650.

As illustrated in FIGS. 1 and 5, a heater unit 7 that is a heating means is provided in a space between the turntable 2 and the bottom part 14 of the chamber 1, and the wafers W on the turntable 2 are heated up to a temperature determined by a process recipe (e.g., 450 degrees C.) through the turntable 2. A ring-shaped cover member 71 is provided on the lower side of the periphery of the turntable 2 to prevent a gas from intruding into a space under the turntable 2 by separating an atmosphere from a space above the turntable 2 through the evacuation areas E1 and E2 and an atmosphere in which the heater unit 7 is disposed (see. FIG. 5).

As illustrated in FIG. 5, the cover member 71 includes an inner member 71a provided so as to face the outer edge portion of the turntable 2 and a further outer portion from the lower side, and an outer member 71b provided between the inner member 71a and the inner wall surface of the chamber 1. The outer member 71b is provided under the bent portion 46 formed in the outer edge portion of the convex portion 4 and close to the bent portion 46, and the inner member 71a is provided to surround the heater unit 7 throughout the whole circumference under the outer edge portion of the turntable 2 (and the slightly further outer portion).

As shown in FIG. 5, the bottom part 14 in a region closer to the rotational center than the space where the heater unit 7 is arranged forms a protrusion part 12a so as to get closer to the core portion 21 in the center portion of the lower surface of the turntable 2. A gap between the protrusion part 12a and the core portion 21 forms a narrow space. Moreover, a gap between an inner periphery of a through-hole of the rotational shaft 22 that penetrates through the bottom part 14 and the rotational shaft 22 is narrow, and the narrow space is in communication with the case body 20. The case body 20 includes a purge gas supply pipe 72 to supply $N_2$ gas as a purge gas to the narrow space for purging the narrow space.

Furthermore, a single or a plurality of purge gas supply pipes 73 is provided at predetermined angular intervals in the circumferential direction under the heater unit 7 to purge the arrangement space of the heater unit 7. In addition, a lid member 7a that covers from the inner peripheral wall of the outer member 71b (i.e., the upper surface of the inner member 71a) to the upper end of the protrusion part 12a throughout the circumferential direction is provided between the heater unit 7 and the turntable 2 to prevent the gas from entering the area including the heater unit 7. The lid member 7a can be made of, for example, quartz.

Moreover, as shown in FIG. 5, a separation gas supply pipe 51 is connected to the central part of the ceiling plate 11 of the chamber 1, and is configured to supply $N_2$ gas of the separation gas to a space 52 between the ceiling plate 11 and the core portion 21. The separation gas supplied to the space 52 is discharged toward the outer edge through a narrow space 50 between the protrusion portion 5 and the turntable 2, and along the surface of the turntable 2 on the wafer receiving area side. The space 50 can be maintained at a higher pressure than that of the spaces 481 and 482 by the separation gas. Accordingly, the space 50 serves to prevent the first reaction gas supplied to the first process area P1 and the second reaction gas supplied to the second process area P2 from mixing through the center area C. In other words, the space 50 (or the center area C) can function similarly to the separation space H (or the separation area D).

The control unit 101 is to instruct each of the components of the substrate processing apparatus what to do and to control operation of each of the components. The control unit 101 runs a program stored in a memory unit 102 (see FIG. 1) and causes the hardware to carry (place) the wafers W on the concave portions 24 of the turntable, to process the wafers W with a variety of treatments, and to carry the wafers W out of the concave portions 24 by cooperating with each other. Here, the control unit 101 can be constituted of an arithmetic processing unit including a CPU (Central Processing Unit) and a memory (ROM, RAM or the like) and the like that are technologically well known.

More specifically, the control unit 101 stores a program to cause the substrate processing apparatus to implement a method for processing a substrate described later in a built-in memory. This program is constituted of instructions of step groups. The substrate processing apparatus 100 reads the above program stored in a medium 103 (see FIG. 1) into the memory unit 102, and then installs the program into the control unit 101 (i.e., the built-in memory). Here, a hard disk, a compact disc, a magnetic optical disk, a memory card and a flexible disk and the like can be used as the medium 103.

Moreover, the control unit 101 can control operation for supplying the first reaction gas to the upper surface of the turntable 2 by controlling operation of the reaction gas nozzle 31 (first gas supply part). Furthermore, the control unit 101 can control operation for supplying the second reaction gas to the upper surface of the turntable 2 by controlling operation of the reaction gas nozzle 32 (second gas supply part). In addition, the control unit 101 can control operation for supplying the separation gas to the upper surface of the turntable 2 by controlling operation of the separation gas nozzles 41 and 42 (separation gas supply parts).

(Method for Processing Substrates)

In a method for processing a substrate using the above-described substrate processing apparatus 100 according to an embodiment of the present invention, in particular, a description is given below of loading and unloading wafers W with reference to the drawings.

[Method for Loading Substrates]

FIGS. 6A through 6D are schematic diagrams for illustrating an example of a method for loading a substrate according to an embodiment of the present invention. More specifically, FIGS. 6A through 6D are schematic diagrams for illustrating a method for carrying a wafer W in the substrate processing apparatus 100 through a loading and unloading area P2m (see FIG. 2).

Carrying the wafer W in and out of the substrate processing apparatus 100 is performed by using a wafer holding mechanism 25. Hence, a brief description is given below of a configuration of the wafer holding mechanism 25, and then a description is given below of the method for processing the substrate using the wafer holding mechanism 25 (method for loading and unloading the wafer W).

The wafer bolding mechanism 25 includes, for example, three lifting pins 25a and a lifting mechanism 25b that can accommodate each of the lifting pins 25a and can move up and down. Cushioning members 27 are provided on top surface of the lifting mechanism 25b. The cushioning members 27 work as cushions when the lifting mechanism 25b contacts the hack surface of the turntable to protect the hack surface of the turntable 2 and the top surface of the lifting mechanism 25b.

Moreover, through-holes 26 that allow the lifting pins 25a to penetrate therethrough are formed in bottom surfaces 24b of the concave portions 24. Loading and unloading the wafers W on and from the concave portions 24 are performed by way of the lifting pins 25a that, pass through the through-holes 26. Because of this, a hole diameter of the through-holes 26 is designed to be greater than that of the lifting pins 25a. When the lifting mechanism 25b contacts the back surface of the turntable 2 via the cushioning members 27, each of the cushioning members 27 is provided to surround outer circumference of each of the through holes 26.

The lifting mechanism 25b is configured to be able to move the lifting pins 25a in a vertical direction (movable up and down) and inward in a radius direction of the turntable 2. The movement of the lifting pins 25*a* inward in the radial direction is performed within a range of a clearance between a diameter of the through-holes 26 and a diameter of the lifting pins 25*a*.

In general, the difference between the hole diameter of the through-hole 26 and the pin diameter of the lifting pin 25*a* is a maximum movable distance of the lifting pins 25*a* in the radial direction. Although the pin diameter is not limited, the pin diameter of the lifting pins 25*a* may be, for example, φ 3.5 mm, and the hole diameter of the through-holes 26 may be, for example, φ 9.5 mm. Moreover, as discussed above, the concave portions 24 have the inner diameter slightly, more specifically about 1 through 4 mm, greater than the diameter of the wafers W. Due to this, the movable distance of the lifting pins 25*a* inward in the radial direction is greater than the clearance between the concave portion 24 and the wafer W in the radial direction.

Figure 6A:
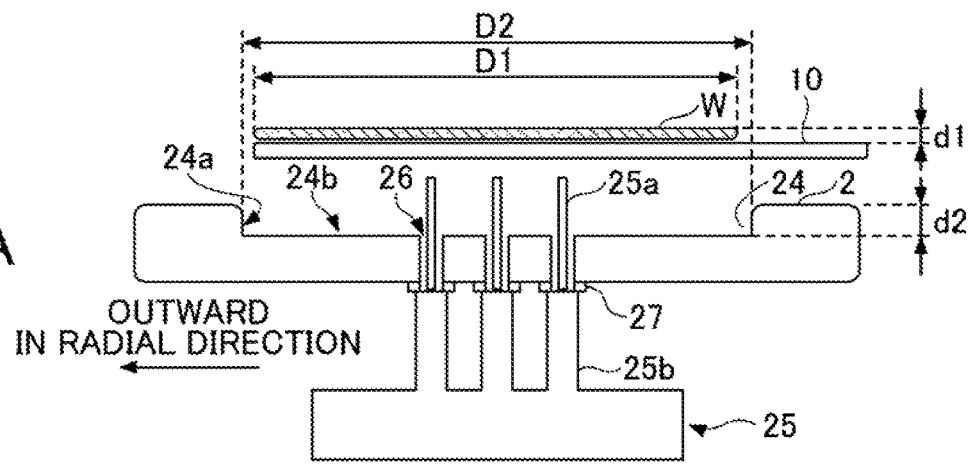
FIGS. 6A through 6D are schematic diagrams for illustrating an example of a substrate carry-in method according to an embodiment of the present invention.

In loading the wafers W, to begin with, the turntable 2 is intermittently rotated to set a predetermined concave portion 24 at a position facing the loading and unloading area P2m. Then, as illustrated in FIG. 6A, the wafer W is transferred to a position above the lifting pins 25*a* by using the transfer arm 10 while keeping upper ends of the lifting pins 25*a* in a higher position than the concave portion 24. The position of the wafer W transferred by the transfer arm 10 is higher than that of the upper end of the lifting pins 25*a*. Here, in the embodiment, the wafer W is moved by using the transfer arm 10 so that the center of the wafer W is roughly positioned at the center of the concave portion 24

Figure 6B:
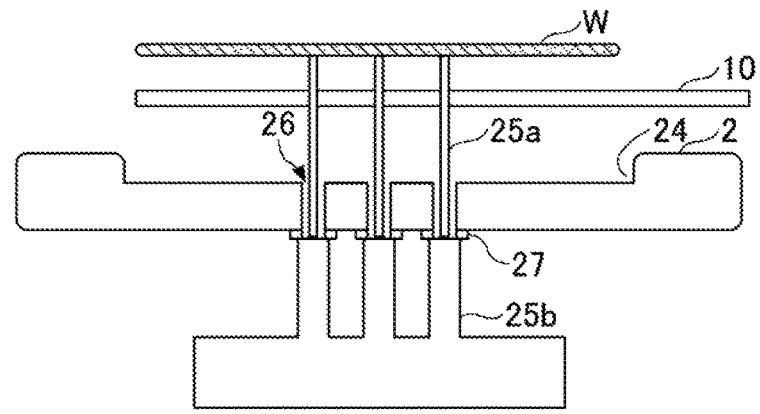

Next, as illustrated in FIG. 6B, the lifting pins 25*a* are further moved up and then contact the wafer W. Subsequently, the lifting pins 25*a* are further moved up. This causes the wafer W to be positioned at a predetermined distance from the transfer arm 10 on the upper side of the transfer arm 10.

Figure 6C:
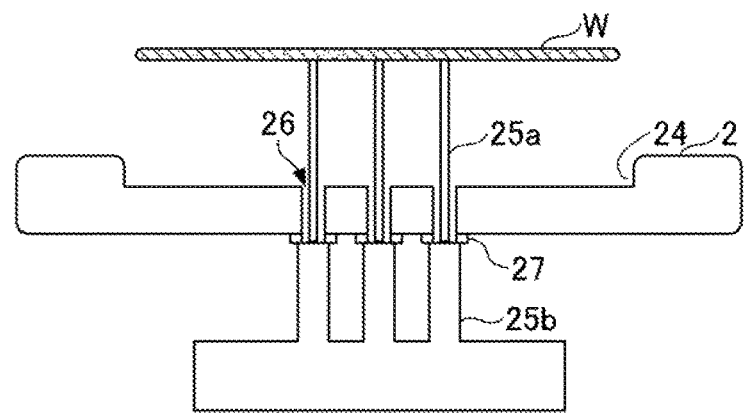

Then, as illustrated in FIG. 6C, the transfer arm 10 is moved from the transfer opening 15 to the outside of the substrate processing apparatus 100.

Figure 6D:
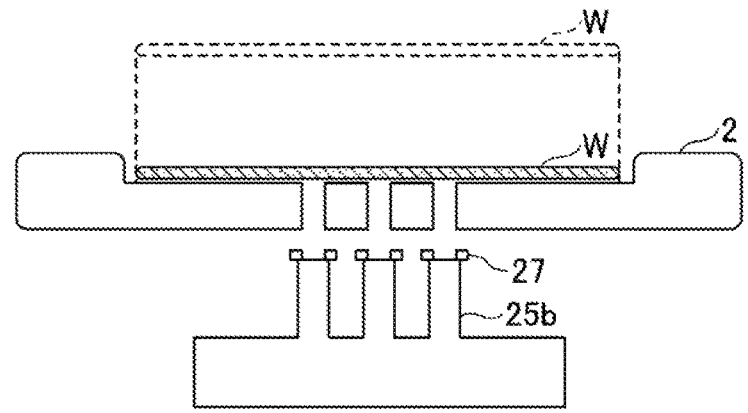

Finally, as illustrated in FIG. 6D, by moving the lifting pins 25*a* down in a vertical direction, the wafer W is placed on the concave portion 24. Here, in FIG. 6D, the original position of the wafer W is illustrated by a dashed line. Although the cushioning members 27 are fixed to the back surface of the turntable 2 in FIG. 6A through 6C, the cushioning members 27 detach from the back surface of the turntable 2 in FIG. 6D.

Here, as illustrated in FIG. 6A, an inner diameter D2 of the concave portion 24 that receives the wafer W thereon is slightly, more specifically, about 1 to 4 mm, greater than a diameter D1 of the wafer W. Moreover, a depth D2 of the concave portion 24 is configured to be as almost deep as a thickness d1 of the wafers W or deeper than the thickness d1 of the wafer W. However, FIGS. 6A through 6D illustrate an example of the diameter D2 of the concave portion 24 relatively greater than that of the diameter D1 of the wafer W. Moreover, although the description has been given hereinabove of an example of a side wall 24*a* of the concave portion 24 formed perpendicularly to a bottom surface 24*b* of the concave portion 24, the embodiments of the present invention are not limited in this regard. The concave portion 24 may have a taper shape that increases its diameter with increasing distance from the bottom 24*b*.

A description is given below of a more preferable embodiment with respect to the transfer of the wafer W to the concave portion 24, with reference to FIGS. 7A through 7D. FIGS. 7A through 7D illustrate schematic diagrams for illustrating another example of a method for loading a substrate according to an embodiment of the present invention. Because processes specified in FIGS. 7A through 7D are similar to the processes illustrated in FIGS. 6A through 6D, a similar description is omitted. That is to say, in FIG. 7C, the wafer W is in contact with the lifting pins 25*a*, and the transfer arm 10 is moved to the outside of the substrate processing apparatus 100 from the transfer opening 15.

Figure 7A:
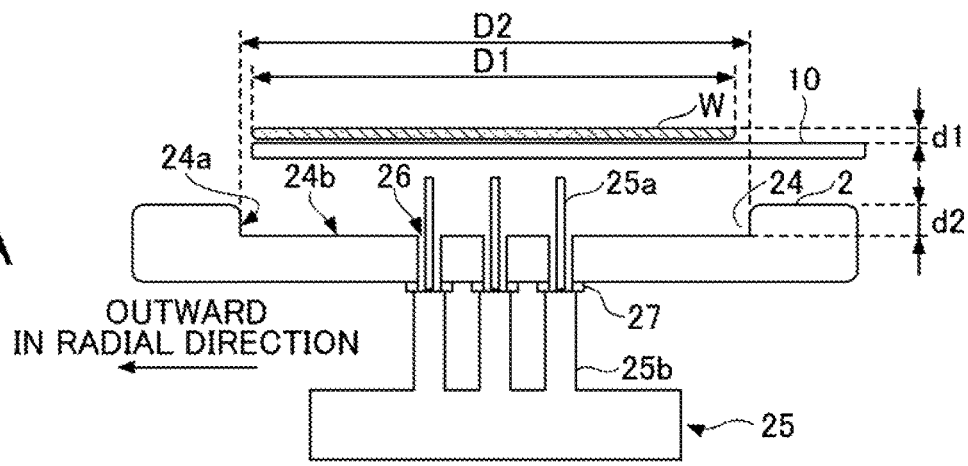
FIGS. 7A through 7D are schematic diagrams for illustrating another example of the substrate carry-in method according to an embodiment of the present invention.
Figure 7B:
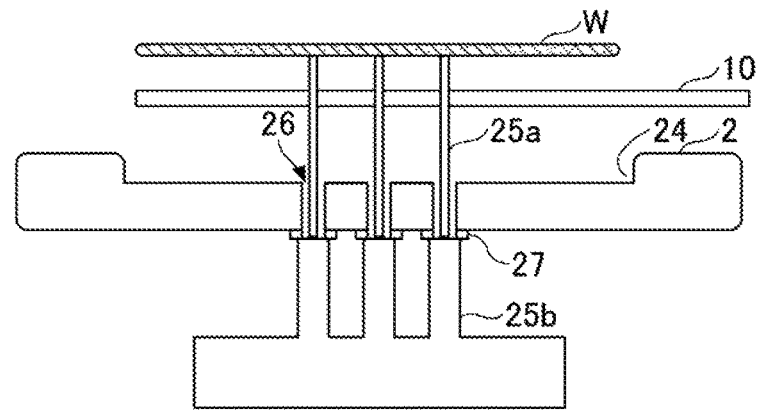
Figure 7C:
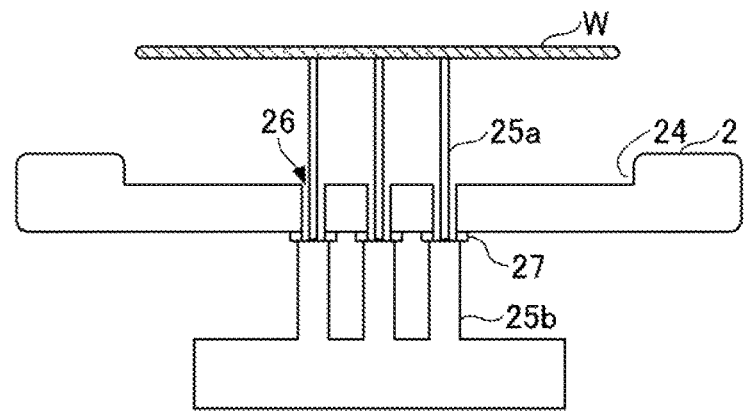
Figure 7D:
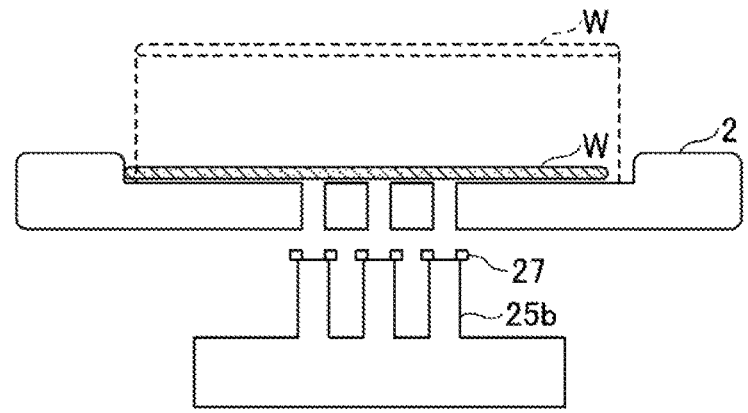

In FIG. 7D, the lifting pins 25*a* move down in a vertical direction and outward in a radial direction with respect to the rotation of the turntable 2. This causes the wafer W placed on the concave portion 24 to be moved outward in the radial direction of the turntable relative to the displaced position of the wafer W illustrated in FIG. 6D. Here, in FIG. 7D, the original position of the wafer W in FIG. 7C is illustrated by a dashed line.

The movement of the wafer W outward in the radial direction in FIG. 7D is preferably set to the extent that the wafer W does not touch the side wall 24*a* of the concave portion 24. When the wafer W touches the side wall 24*a*, particles can be generated from a contact location. Furthermore, an outer surface of the wafer W can be damaged when the wafer W is rubbed against the side wall 24*a*.

After placing the wafer W on the concave portion 24 as described by using FIGS. 6A through 6D and 7A through 7D, a variety of processes (e.g., film deposition process) is performed on the wafer W. At the time, because the turntable 2 rotates, the wafer W moves outward in the radial direction of the turntable 2 by a centrifugal force. In the embodiment illustrated in FIGS. 7A through 7D, the placed position of the wafer W is shifted outward in the radial direction with respect to the rotation of the turntable 2 compared to the case in the embodiment illustrated in FIGS. 6A through 6D. This can reduce an impact due to a collision between the wafer W and the side wall 24*a* even when the centrifugal force is applied to the wafer W by the rotation of the turntable 2 while processing the wafer W (e.g., film deposition process) after placing the wafer W and the wafer W is further moved outward in the radial direction. In other words, the generation of the particles and a flaw due to the collision can be reduced compared to the embodiment illustrated in FIGS. 6A through 6D.

[Method for Unloading Substrates]

Next, a description is give below of a method for unloading the wafer W after performing, for example, a film deposition process on the wafer W placed on the concave portion 24, with reference to the drawings.

FIGS. 8A through 8D are schematic diagrams for illustrating an example of the method for unloading the substrate according to an embodiment of the present invention. Moreover, FIGS. 9A through 9D are schematic diagrams for illustrating movements of the lifting pins 25*a* and the wafer W from FIG. 8A to FIG. 8B. Here, FIGS. 9A through 9D illustrate the components in FIGS. 8A through 8D further schematically for the purpose of illustration. More specifically, FIGS. 9A through 9D illustrate only a single lifting pin 25*a* and an example of schematically illustrating the diameter D2 and the depth d2 of the concave portion 24 relatively larger than the diameter D1 and the depth d1 of the wafer W, respectively. Furthermore, the left drawings in FIGS. 9A through 9D correspond to the right diagrams, respectively, and positions of the upper end of the lifting pin 25*a* when the lifting pin 25*a* in the left drawings linearly moves from positions of solid lines to positions of dashed lines correspond to starting points and ending points of arrows in the right diagrams, respectively.

In unloading the wafer W, first, the turntable 2 is rotated intermittently so that a predetermined concave portion 24 comes to a position facing the loading and unloading area P2m (see FIG. 3).

As illustrated in FIG. 8A, at this time, the center of the wafer W after the film deposition process is located on the outer edge side relative to the center of the concave portion. This is because the wafer W is subject to the influence of the centrifugal force due to the rotation of the turntable 2.

Figure 9A:
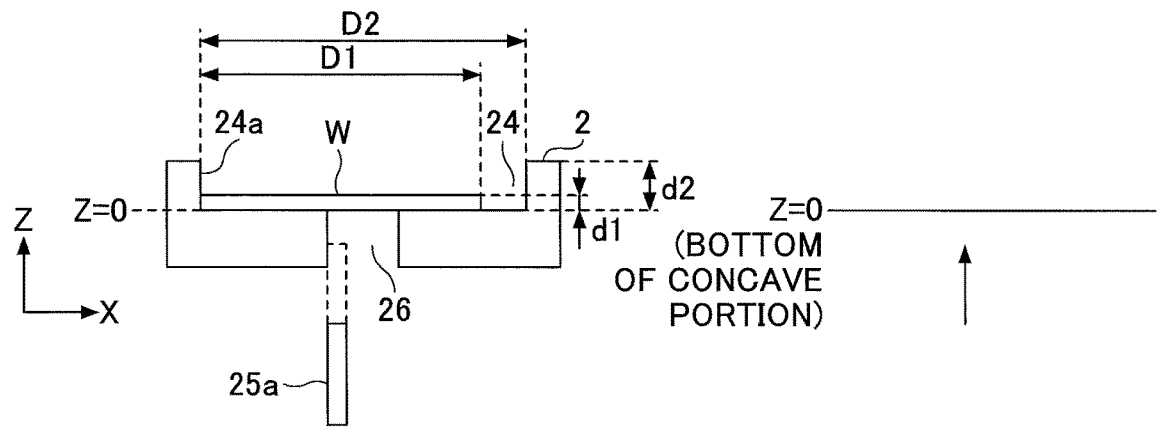
FIGS. 9A through 9D are schematic diagrams for illustrating movement of lift pins and a wafer.

In this state, as illustrated in FIG. 9A, the lifting pin 25a is moved up by the lifting mechanism 25b up to a position close to the bottom of the wafer W, or until contacting the bottom of the wafer W. The example shown in FIG. 9A illustrates an example of the lifting pin 25a that is moved up to a position close to the bottom of the wafer W (i.e., at a predetermined distance from the bottom of the bottom). Here, because the lifting pin 25a moves inward in the radial direction with respect to the rotation of the turntable 2 in FIG. 9B described later, the lifting pin 25 is preferably moved upward while being shifted outward in the radial direction relative to the center of the through-hole 26 at this time.

Figure 9B:
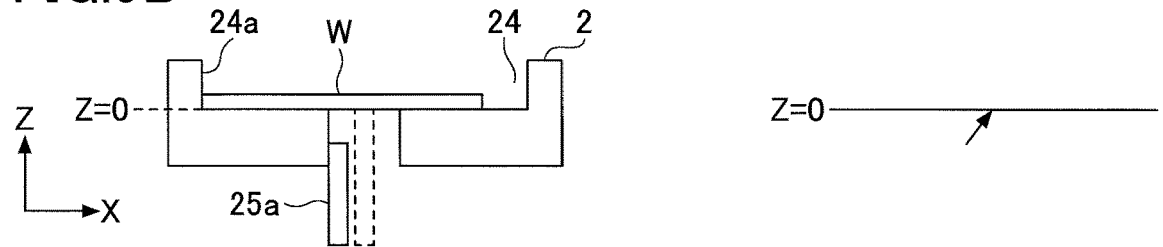

Next, as illustrated in FIG. 9B, the lifting pin 25a is moved up (in the Z axis direction) and outward in the radial direction (X direction), and the upper end of the lifting pin 25a is in contact with the bottom of the wafer W.

Figure 9C:
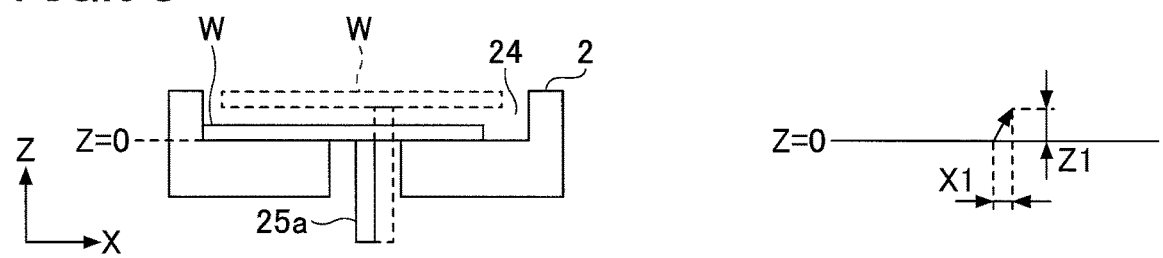

Then, as illustrated in FIG. 9C, the lifting pin 25a is further moved up and inward in the radial direction, thereby lifting the wafer W at a predetermined distance from the concave portion 24. Here, although directions of motion vectors of the lifting pin 25a in FIGS. 9A and 9B are not limited, the directions may be the same as each other. In addition, a position of the lifting pin 25a at the ending point of FIG. 9B (i.e., the starting point in FIG. 9C) may be the center of the concave portion 24.

The positional difference (at absolute value) between a position of the lifting pin 25a in the X axis direction in FIG. 9A and a position of the lifting pin 25a in the radial direction at the ending point in FIG. 9C (i.e., the starting point in FIG. 9D) is a travel distance of the lifting pin 25a in the radial direction. A person skilled in the art sets a variety of parameters so that the travel distance is within a range of the difference (at absolute value) between the pin diameter of the lifting pin 25a and the hole diameter of the through-hole 26.

Figure 9D:
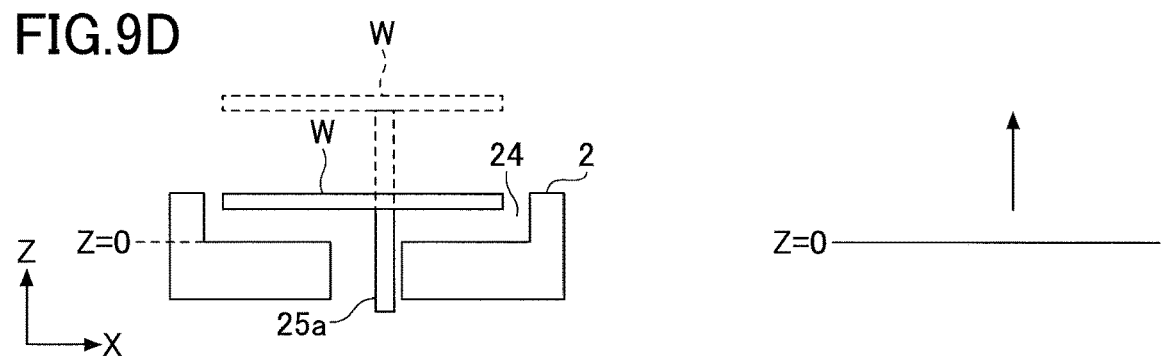

Finally, as illustrated in FIG. 9D, the lifting pin 25a is further moved up and the wafer W is lifted at a distance enough to be able to place the wafer W on the transfer arm 10 from the concave portion 24. As a result, the state illustrated in FIG. 9D goes into the same state as that illustrated in FIG. 8B. Here, although FIG. 9D illustrates an example of moving the lifting pin 25a upward in the vertical direction, as described in FIG. 9C, moving the lifting pin 25a up in the vertical direction and inward in the radial direction is also possible.

After lifting the wafer W at a sufficient distance from the concave portion 24, as illustrated in FIG. 8C, the transfer arm 10 is moved to a position between the bottom surface of the wafer W and the concave portion 24. Next, as illustrated in FIG. 8D, the wafer W is placed on the transfer arm 10 and then carried out of the substrate processing apparatus 100 by way of the transfer arm 10 to the outside.

The method for unloading the substrate according to the embodiment of the present invention moves the wafer shifted outward in the radial direction by various turntable-type substrate processes upward in the vertical direction and inward in the radial direction. This can reduce an amount of particle generation when carrying the wafer W out of the substrate processing apparatus 100 because the wafer W does not contact the side wall 24a of the concave portion 24. Moreover, the breakage of the wafer W can be reduced when carrying the wafer W out of the substrate processing apparatus 100 because the wafer W does not contact the side wall 24a of the concave portion 24.

Here, a travel distance X1 of the lifting pin 25a inward in the radial direction after the lifting pin 25a contacts the bottom of the wafer W, which is illustrated by using FIG. 9C, is preferred to have a relationship of the following formula (1) when using the diameter D2 of the concave portion 24 and the diameter D1 of the wafer W.

$$X1 < D2 - D1 \quad (1)$$

The relational expression shown by formula (1) is to prevent the contact between the wafer W and the side wall 24a located on the inward side in the radial direction of the concave portion 24. By setting the travel distance of the wafer W inward in the radial direction smaller than a predetermined value, the wafer W does not physically contact the side wall 24a of the concave portion. Here, (D2−D1) in formula (1) corresponds to the distance between the right end of the wafer W drawn by the solid line and the side wall 24a of the concave portion 24.

Otherwise, the travel distance X1 of the lifting pin 25a inward in the radial direction and a travel distance Z1 of the lifting pin 25a upward in the vertical direction after the lifting pin 25a contacts the bottom surface of the wafer W may have a relationship of the following formula (2) when using the diameter D2 of the concave portion 24, the diameter D1 of the wafer W and the depth d2 of the concave portion 24.

$$Z1/X1 > d2/(D2 - D1) \quad (2)$$

The relationship of formula (2) is to prevent the contact between the wafer W and the side wall 24a located on the inward side in the radial direction of the concave portion 24 by setting a slope of the lifting pin 25a at a greater value than a predetermined value. Here, (Z1/X1) in formula (2) corresponds to a slope of the lifting pin 25a in FIG. 9C, and {d2/(D2−D1)} corresponds to a slope of a line connecting the right end of the lifting pin 25a and the upper end of the side wall 24a of the concave portion 24.

Here, in formula (1) and formula (2), a dimension of the diameter D1 of the wafer W relates to a wafer W after various substrate processes such as a film deposition process. When the dimension of the wafer W is changed by the film deposition process and a heat treatment, a diameter D1 of the wafer W preliminarily taking the dimension change into account is adopted.

In this manner, the method for processing the substrate (the method of transferring the substrate) according to the embodiments prevents the wafer W from being rubbed against the side wall 24a of the concave portion 24 by moving the lifting pin 25a upward in the vertical direction and inward in the radial direction when unloading the substrate. As a result, the generation of particles from the wafer W can be reduced.

A description is given below of an effect of reducing the generation of particles by moving the wafer W upward in the vertical direction and inward in the radial direction according to the embodiments of the method for processing the substrate, with reference to specific working examples.

Working Examples

Silicon wafers W were placed on two of the concave portions 24 on the turntable 2 in the substrate processing apparatus 100 described by using FIG. 1 by the method for loading the substrate using FIGS. 7A through 7D. Here, the wafers W having the diameter D1 of φ 300 mm and the turntable 2 having the concave portion 24 with the diameter D2 of φ 302 mm and the depth d2 of 1.8 mm were used.

A film deposition process was performed on the placed wafers W under the following process conditions.

The process conditions were as follows:
Temperature: 600 degrees C.;
Pressure: 6.7 Torr;
First Reaction Gas/Flow Rate: Tris(dimethylamino)silane (3DMAS)/300 sccm;
Second Reaction Gas/Flow Rate: $N_2$/420 sccm; and
Rotational Speed: 120 rpm.

A diameter D1' of the wafer W after the film deposition process was about φ 301 mm.

Next, by following the track of the lifting pins 25a illustrated in FIGS. 8A through 8D, one of the wafers W was carried out of the concave portion 24. Here, the travel distance X1 of the lifting pins 25a inward in the radial direction after the lifting pins 25a contact the wafer W was set at 0.2 mm. The travel distance X1 satisfies the relationship of formula (1) of X1 (0.2 mm)<D2 (302 mm)−D1 (301 mm).

Furthermore, at the same time, the remaining wafer W was carried out of the concave portion 24 without moving the track of the lifting pins 25a inward in the radial direction and moving the track of the lifting pins 25a upward in the vertical direction.

After carrying the wafers W out of the concave portions 24, an amount of generated particles from each of the concave portions 24 was measured. This step was made one unit step, and amounts of generated particles were measured for a total of five steps (working examples 1 through 5 and comparative examples 1 through 5).

Figure 10:
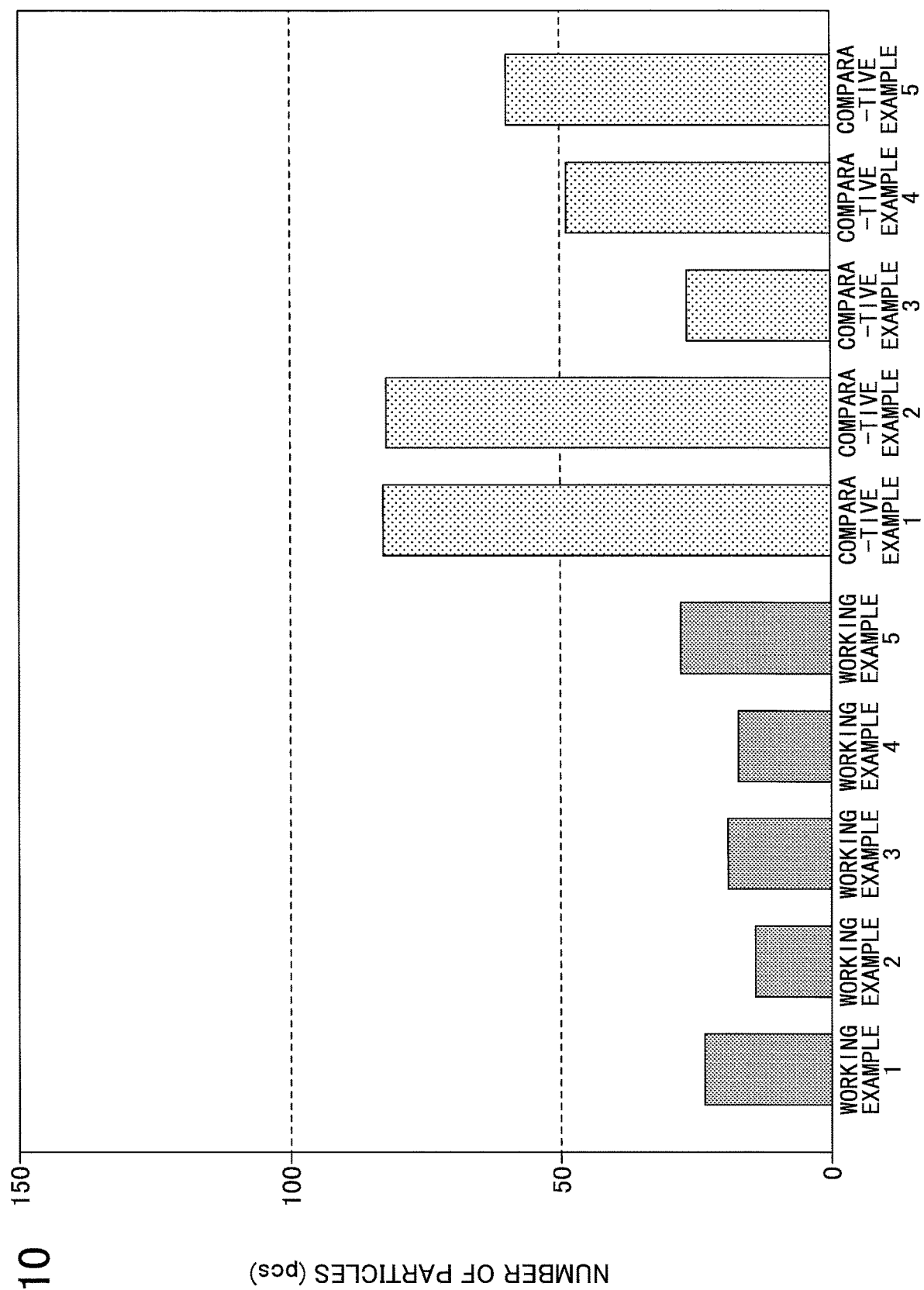
FIG. 10 is an example of the number of particles after implementing the method for processing a substrate according to an embodiment of the present invention.

FIG. 10 illustrates examples of the number of particles after performing the method for processing the substrate of the working examples 1 through 5 and the comparative examples 1 through 5.

As illustrated in FIG. 10, it was found that the method for processing the substrate according to the working examples could reduce the generation of particles because the wafers W were not rubbed against the side walls of the concave portions 24 when carrying the substrates (wafers W) out of the concave portions 24.

According to the embodiments of the present invention, a substrate processing apparatus and a method for processing a substrate can be provided that can reduce the generation of particles when unloading a wafer.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention.

What is claimed is:

1. A substrate processing apparatus to deposit a film including a reaction product on a substrate by repeating a supply cycle of sequentially supplying at least two kinds of reaction gases reactable with each other to a surface of the substrate in a chamber, the substrate processing apparatus comprising:

a turntable provided in the chamber and having a concave portion for receiving the substrate formed in its surface and through-holes formed in the concave portion;

a lifting mechanism including lift pins used when transferring the substrate placed on the concave portion; and a cushioning member attached to a top surface of the lifting mechanism to allow the lifting mechanism to contact a back surface of the turntable, the lifting mechanism being configured to move up the lift pins while contacting the back surface of the turntable via the cushioning member attached to the top surface thereof; and a control unit configured to control an operation of the lifting mechanism, the control unit controlling the lifting mechanism so as to carry the substrate out of the concave portion by moving the lifting pins upward in a vertical direction and inward in a radial direction of the turntable while contacting the lower surface of the turntable, after the lifting pins contact the substrate through the through-holes upon finishing depositing the film on the substrate, wherein a travel distance X1 of the lifting pins inward in the radial direction after the lifting pins contact the substrate, has a relationship of X1<D2−D1 when using a diameter D1 of the substrate placed on the concave portion and a diameter D2 of the concave portion, wherein a travel distance X1 of the lifting pins inward in the radial direction of the turntable, a travel distance Z1 upward in the vertical direction, a diameter D1 of the substrate placed on the concave portion, a diameter D2 of the concave portion and a depth of the concave portion d2, while the lifting pins move upward in the vertical direction and inward in the radial direction after contacting the substrate, have a relationship of Z1/X1>d2/(D2-D1).

2. The substrate processing apparatus as claimed in claim 1, further comprising: a first reaction gas supply part to supply a first reaction gas to the substrate on the concave portion and provided in a first supply area in the chamber; and a second reaction gas supply part to supply a second reaction gas to the substrate on the concave portion and provided in a second supply area apart from the first supply area along a rotational direction of the turntable.

3. The substrate processing apparatus as claimed in claim 2, further comprising: separation gas supply parts to discharge a separation gas for separating the first reaction gas and the second reaction gas and provided between the first reaction gas supply part and the second reaction gas supply part in the rotational direction and between the second reaction gas supply part and the first reaction gas supply part in the rotational direction.

4. The substrate processing apparatus as claimed in claim 3, wherein the separation gas supply parts include a ceiling surface forming a separation space having a predetermined height between the surface of the turntable and the ceiling surface, and the predetermined height forming the separation space of the separation gas supply part is lower than respective heights of spaces forming the first reaction gas supply part and the second reaction gas supply part.

5. The substrate processing apparatus as claimed in claim 1, wherein a plurality of concave portions is provided in the turntable, and three of the lifting pins are provided for each of the plurality of concave portions.

* * * * *